(12) United States Patent
Dannenmann et al.

(10) Patent No.: US 7,327,278 B2
(45) Date of Patent: Feb. 5, 2008

(54) METHOD AND APPARATUS FOR TRACING REMOTE ENDS OF NETWORKING CABLES

(75) Inventors: John Dannenmann, Portland, OR (US); Ronald Helgerson, Boring, OR (US)

(73) Assignee: Alan J. Brown, Chicago, IL (US)

(*) Notice: Subject to any disclaimer, the term of this patent is extended or adjusted under 35 U.S.C. 154(b) by 0 days.

(21) Appl. No.: 11/207,641

(22) Filed: Aug. 19, 2005

(65) Prior Publication Data
US 2006/0057876 A1 Mar. 16, 2006

Related U.S. Application Data

(63) Continuation-in-part of application No. 10/360,882, filed on Feb. 7, 2003, now Pat. No. 6,975,242, which is a continuation of application No. 09/460,775, filed on Dec. 14, 1999, now Pat. No. 6,577,243.

(51) Int. Cl.
*G09F 9/33* (2006.01)
*G01R 19/00* (2006.01)

(52) U.S. Cl. .......... 340/815.45; 340/815.47; 340/596; 324/66; 439/490; 370/241

(58) Field of Classification Search .......... 340/815.45, 340/815.47, 596, 816.47
See application file for complete search history.

(56) References Cited

U.S. PATENT DOCUMENTS

| 4,631,698 A | 12/1986 | Walsh et al. |
|---|---|---|
| 4,890,102 A | 12/1989 | Oliver |
| 4,978,317 A | 12/1990 | Pocrass |
| 5,081,627 A * | 1/1992 | Yu .............................. 714/46 |
| 5,249,183 A | 9/1993 | Wong et al. |
| 5,428,671 A | 6/1995 | Dykes et al. |
| 5,577,023 A | 11/1996 | Marum et al. |
| 5,601,451 A | 2/1997 | Driones et al. |
| 5,666,453 A * | 9/1997 | Dannenmann .............. 385/101 |
| 5,741,152 A | 4/1998 | Bourtros |

(Continued)

OTHER PUBLICATIONS

Bejed Inc., "See the Connection", Dec. 1990.

(Continued)

*Primary Examiner*—Donnie L. Crosland
(74) *Attorney, Agent, or Firm*—Katten Muchin Rosenman LLP; John S. Paniaguas (57) ABSTRACT

A method and a circuit is disclosed that facilitates identifying a remote end and optionally an intermediate location of an installed cable, such as a cable for carrying data, without the need to disconnect the cable. One or more circuits may be connected across two wires along the length of a cable. Each circuit includes a power connector, a switching circuit and an indicator, such as a light emitting diode (LED), connected across the two wires included in a cable. The circuit is configured such that the indicator in each circuit connected to the two wires is illuminated in responsive to a nominal DC voltage applied to the power connector in any circuits connected across the two wires without disrupting any data being carried thereby. In one embodiment of the invention, the circuit is directly into a cable connector. In an alternate embodiment of the invention, the circuit is configured to be retrofit in the field for use with existing cables.

3 Claims, 12 Drawing Sheets

U.S. PATENT DOCUMENTS 5,764,043 A    6/1998   Czosnowski et al.
6,099,349 A    8/2000   Boutros
6,102,741 A    8/2000   Boutros et al.
6,577,243 B1 * 6/2003   Dannenmann et al. . 340/815.45

OTHER PUBLICATIONS

Kenney, "Back to Basics Understanding PTP Cabling", CBM, May 1999, pp. 34-41.

* cited by examiner

METHOD AND APPARATUS FOR TRACING REMOTE ENDS OF NETWORKING CABLES

CROSS-REFERENCE TO RELATED APPLICATIONS

The present application is a continuation-in-part of commonly owned application Ser. No. 10/360,882, filed on Feb. 7, 2003, now U.S. Pat. No. 6,975,242 which, in turn, is a continuation of application Ser. No. 09/460,775, filed on Dec. 14, 1999, now U.S. Pat. No. 6,577,243.

BACKGROUND OF THE INVENTION

1. Field of the Invention

The present invention relates to a method and a circuit that facilitates identifying a remote end and optionally an intermediate location of an installed cable, such as a cable for carrying data, without the need to disconnect the cable and includes a circuit at one or more locations along the cable; the circuit including a power connector, a switching circuit and an indicator, such as a light emitting diode (LED), connected across a two wires in a cable for carrying data; the circuit being configured such that the indicator in each circuit is illuminated in response to a nominal voltage being applied to the power connector in any circuit connected to the two wires without disrupting any data being carried by the two wires in the cable.

2. Description of the Prior Art

The purpose of any networking cable is to carry data from one computer-related device to another. Computer-related devices include terminals, personal computers, printers, workstations, hubs, switches, storage devices, tape drives, and servers. Networking cables, frequently referred to as "jumper cables", "jumpers", or simply "cables", typically are multiple pair copper wires packaged in an outer flexible sheath. Networking cables are designed to interconnect a computer-related device with another computer-related device. Such networking cables often are used in systems where there are many networking cables connected to frames or panels, each of which may have many connecting cables and which may be located closely adjacent other similar panels, sometimes without carefully regimented management of the cables. The connections of each cable may be remote from one another, even being in separate rooms or spaces, whereby the networking cables may be of substantial length.

One example of such use of networking cables is in computer centers where it is often necessary to connect a networking cable from an individual workstation at one location with another networking cable from a computer server remote from the workstation. Further the interconnections sometimes are located in crowded and/or cramped quarters. Tracing and identifying a remote connector section or end of a specific cable for changing its connection in a network or to facilitate replacement often is difficult, tedious and time consuming, and can lead to errors which create further service problems and additional costs.

Various methods and systems have been developed for locating the ends of a networking cable. One such method is a trial and error process that requires personnel to use test equipment at both ends of each and every wire pair to identify the termination points. This process may be labor intensive and expensive. The second method is a variation of the first method and involves the use of equipment to send a tone on a wire pair and then detect a particular frequency at the termination point. This process is also labor intensive.

Also, to determine termination points, the cable needs to be disconnected from the computers connected to the network. As a result, these methods interfere with performance and require the workstation to be taken out of service. In addition, both systems require the test person to walk from one end of a test point to the other end. If the workstation and server are located in separate rooms or in remote locations, the previous methods are labor intensive and inefficient for easy detection of termination ends.

In the telecommunications context, U.S. Pat. No. 5,666,453 discloses a specialized fiber optic jumper cable for tracing remote connective portions of a fiber optic cable which includes a composite fiber cable, fiber optic connectors, electrically powered light emitting devices at the connectors, and a pair of electrical conductors embedded in the cable, with one or more electrical power connectors for selectively applying an external electrical power source to the light emitting devices. An LED and an electric power connector suitable for plug-in connection of a power pack are affixed to the cable adjacent each end such that both LEDs are lighted whenever power is applied to either of the electrical connectors. The attendant illumination of the LEDs provides an indication that the tracer system is activated and functioning properly and readily indicates where both ends of the same jumper cable are located. The electrical conductors also may be used for convenient telephonic communication by service personnel.

There is a need for an improved mode of readily tracing networking cables to easily and accurately identify a remote portion, and particularly to identify a remote end.

SUMMARY OF THE INVENTION

Briefly, the present invention relates to a method and a circuit that facilitates identifying a remote end and optionally an intermediate end of an installed cable, such as a cable for carrying data, without the need to disconnect the cable. One or more circuits may be connected across two wires in the cable along its length. Each circuit includes a power connector, a switching circuit and an indicator, such as a light emitting diode (LED) connected across two wires included in the cable. The circuit is configured such that the indicator in each circuit connected to the two wires is illuminated in response to a nominal DC voltage applied to the power connector in any circuits connected across the two wires without disrupting any data being carried thereby. In one embodiment of the invention, the circuit is integrated into a cable connector. In an alternate embodiment of the invention, the circuit is configured to be retrofit in the field for use with existing cables.

BRIEF DESCRIPTION OF THE DRAWINGS

These and other advantages of the present invention will be readily understood with reference to the attached specification and attached drawing, wherein.

DETAILED DESCRIPTION

The present invention relates to a method and a circuit that facilitates identifying a remote end and optionally an intermediate location of an installed cable, such as a cable for carrying data, such as an Ethernet cable, without the need to disconnect the cable. In accordance with one aspect of the present invention, the circuit may be connected across two wires in a cable at one or more locations along its length. Each circuit includes a power connector, a switching circuit and an indicator, such as a light emitting diode (LED). The circuit is configured such that the indicators in all circuits connected across the two wires are illuminated in response to a nominal voltage being applied to a power connector in any of the circuits connected across the two wires without disrupting any data being carried by the two wires.

Figure 1:
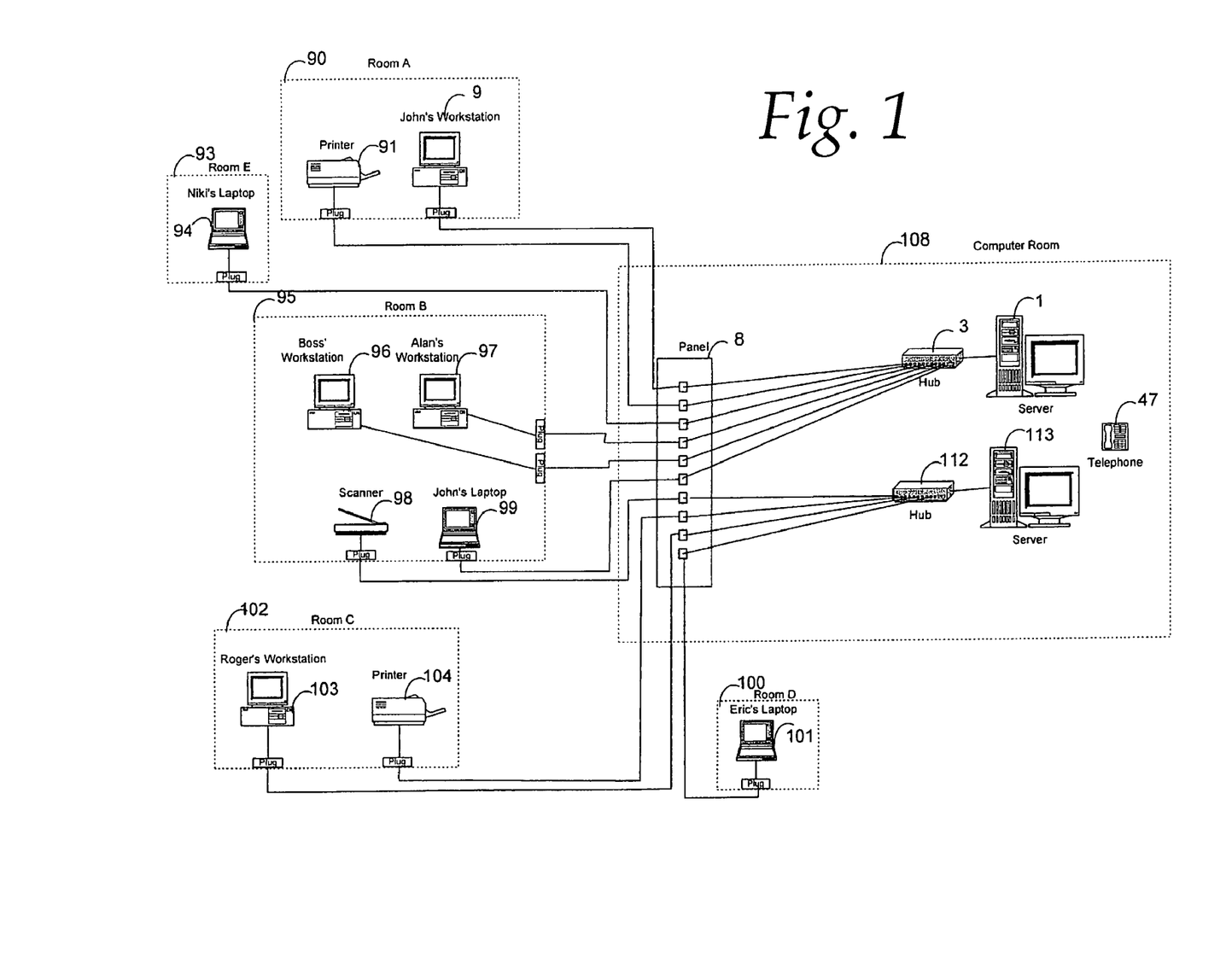
FIG. 1 is an illustration of a typical computer network employing the teachings of this invention.

FIG. 1 illustrates a number of exemplary applications of the circuit in accordance with the present invention. Two embodiments of the circuit in accordance with the present invention are disclosed herein and are suitable for use in virtually any application including the exemplary applications illustrated in FIG. 1. Both embodiments include a circuit which includes a power connector, a switching circuit and an indicator, connected between a single two wires that are also used to carry data. In a normal mode of operation (i.e. a condition when the voltage applied to the power connector in any circuit connected across the two wires is either zero or less than a nominal value), the circuit presents a high impedance across the two wires over the anticipated operating frequencies of the cable. In an indication mode, when a nominal DC voltage is applied to the power connector in any circuit connected across the two wires, the indicators in all of the circuits connected to the two wires will illuminate.

Figure 8:
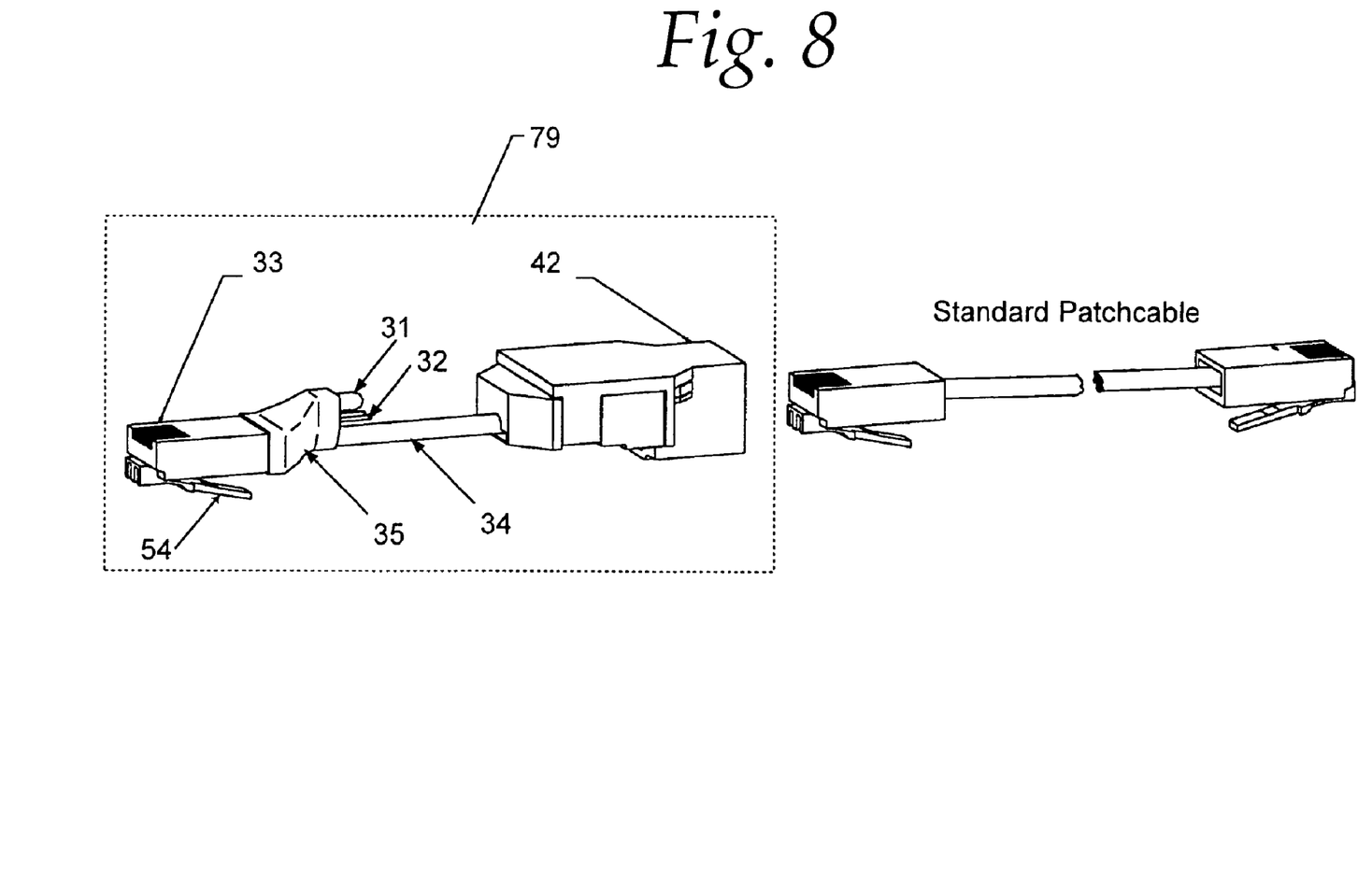
FIG. 8 illustrates an embodiment wherein a networking cable adapter embodies the teachings of the present invention.
Figure 9:
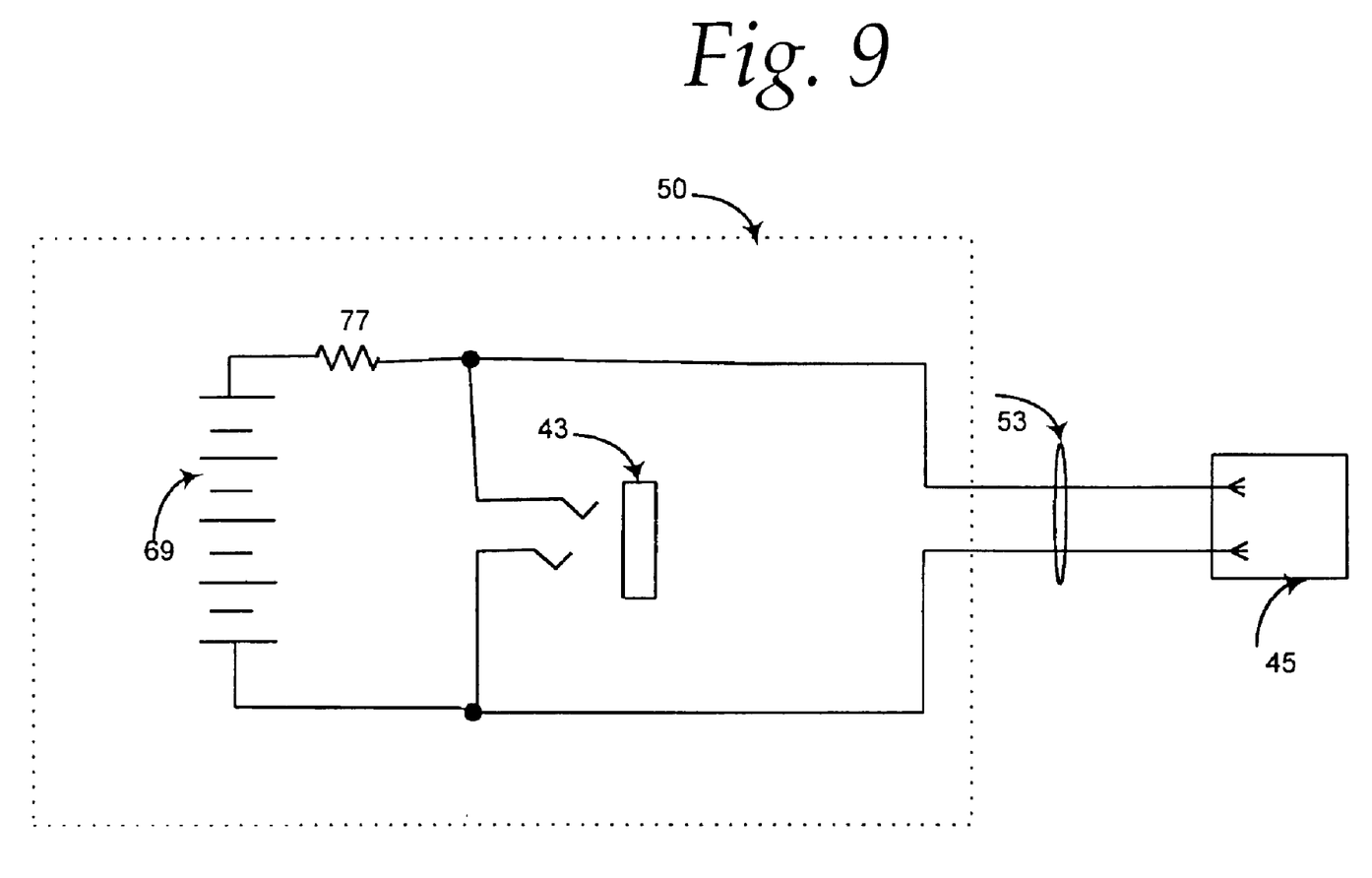
FIG. 9 illustrates an electrical power circuit of the power pack 50 in FIG. 5.
Figure 10:
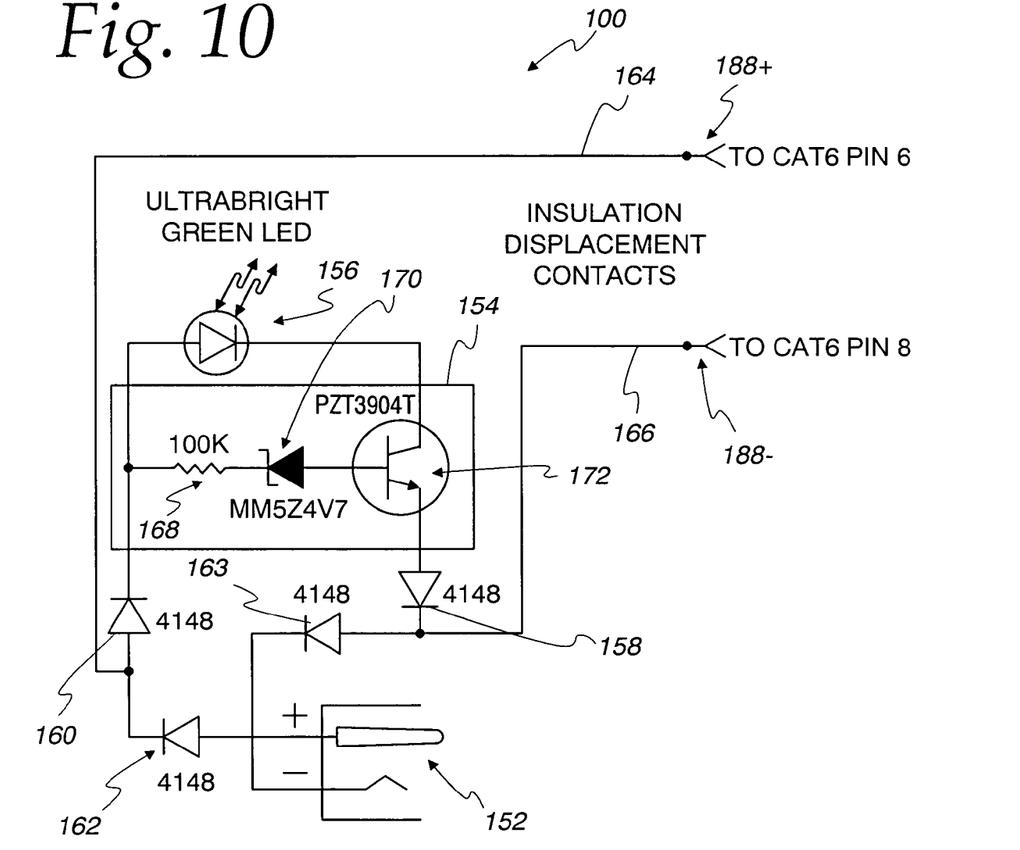
FIG. 10 is a schematic diagram of an alternative embodiment of a circuit in accordance with the present invention.

One embodiment of the circuit in accordance with the present invention is illustrated in FIGS. 2-9 and includes a power connector configured as a two power pins. The circuit in that embodiment is designed to take into account the impedance of the pair of power pins and includes an inductance element. An alternative embodiment of the circuit is illustrated in FIG. 10 and utilizes a coaxial power connector which eliminates the need for the inductance. Either embodiment may utilize an inductance or a capacitance element to compensate for the impedance in the power connectors.

Figure 11:
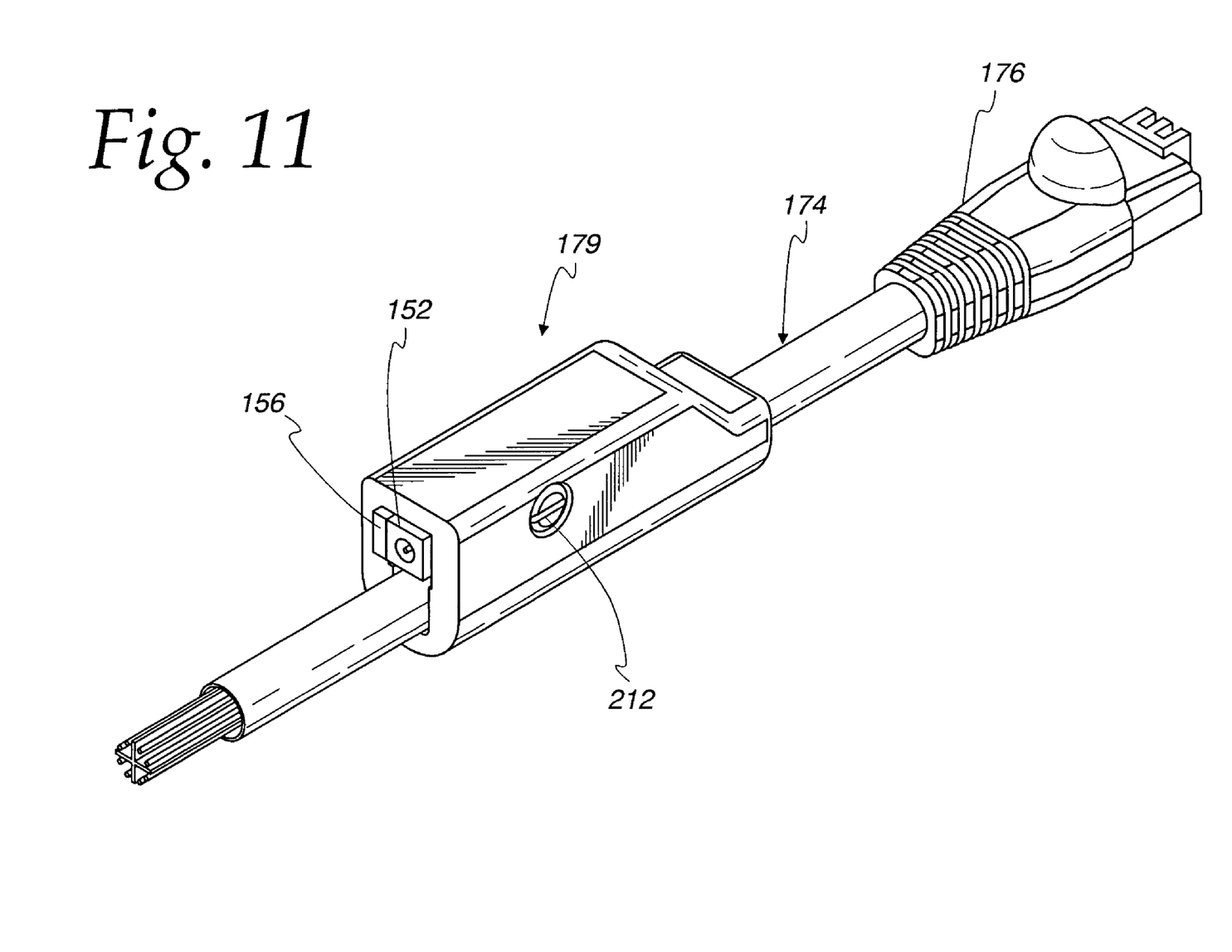
FIG. 11 is an isometric view of an alternative retrofit implementation of the invention illustrating a separate housing installed along the length of a cable which houses the circuit in accordance with the present invention.
Figure 12A:
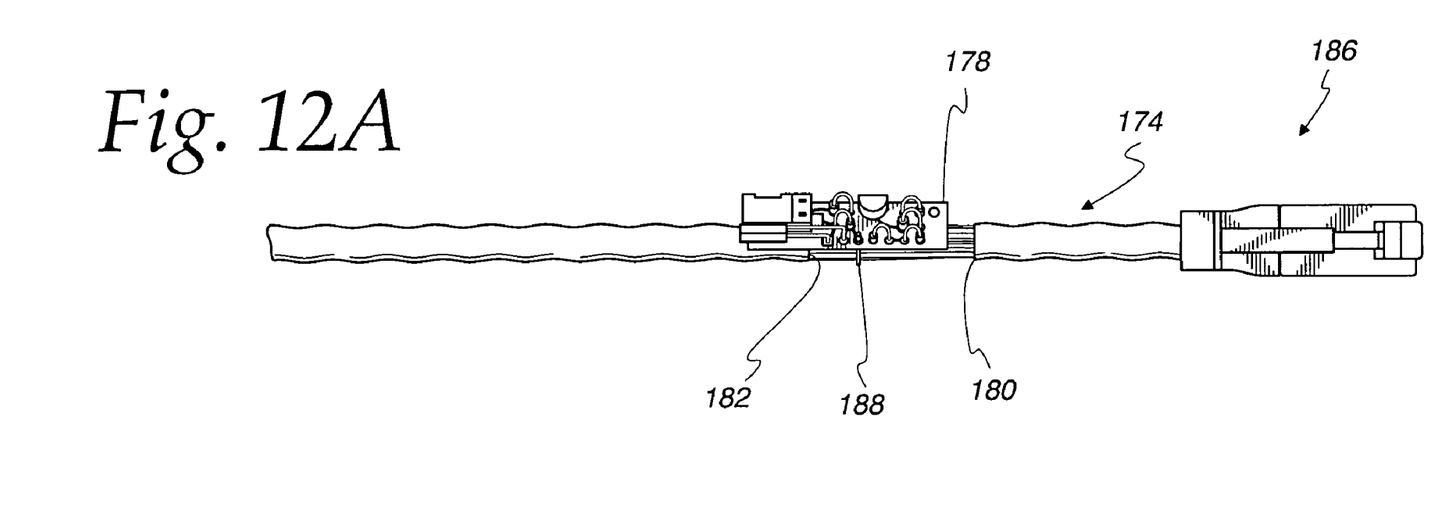
FIG. 12A is a plan view illustrating a portion of a data cable with a portion of the outer jacket removed and a top view of a printed circuit board carrying the circuit in accordance with the present invention connected to two wires in the cable.
Figure 12B:
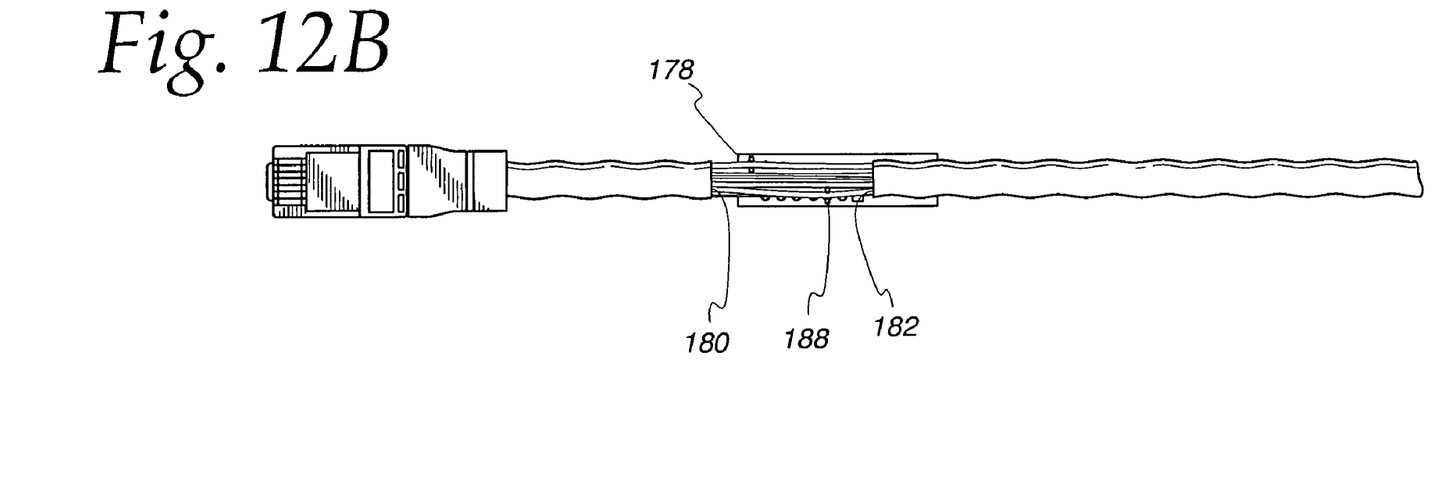
FIG. 12B is similar except that it illustrates a bottom view of the printed circuit board.
Figure 13A:
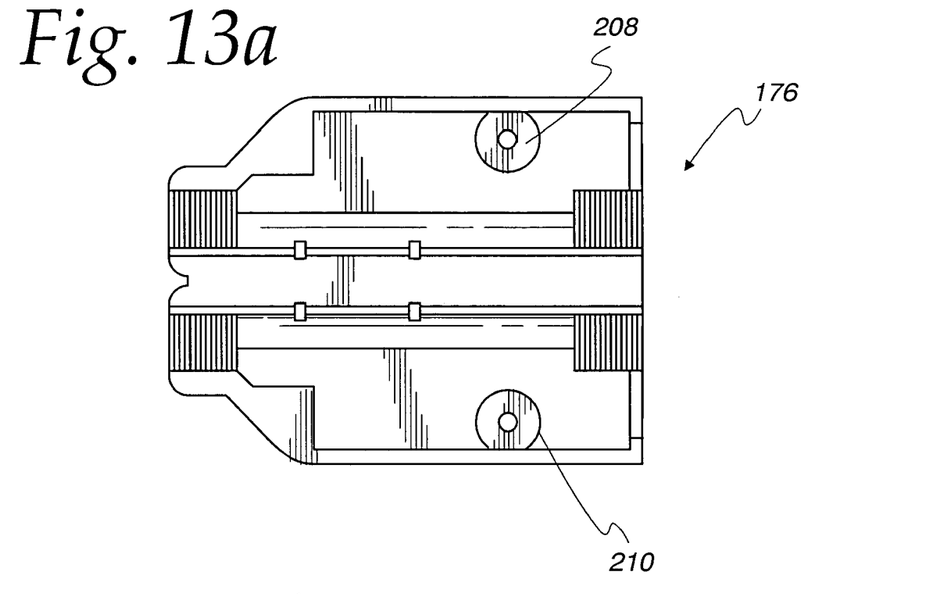
FIG. 13A is an isometric view of the housing illustrated in FIG. 11, shown in an open position.
Figure 13B:
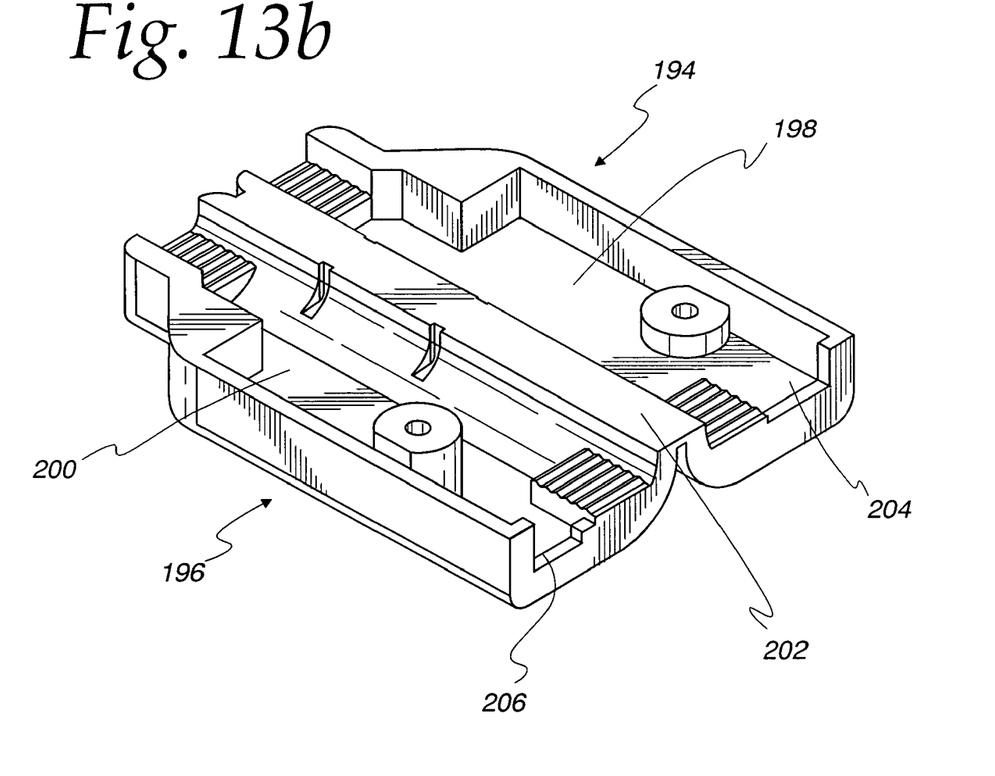
FIG. 13B is a top plan view of the housing illustrated in FIG. 13A, shown in an open position.
Figure 13C:
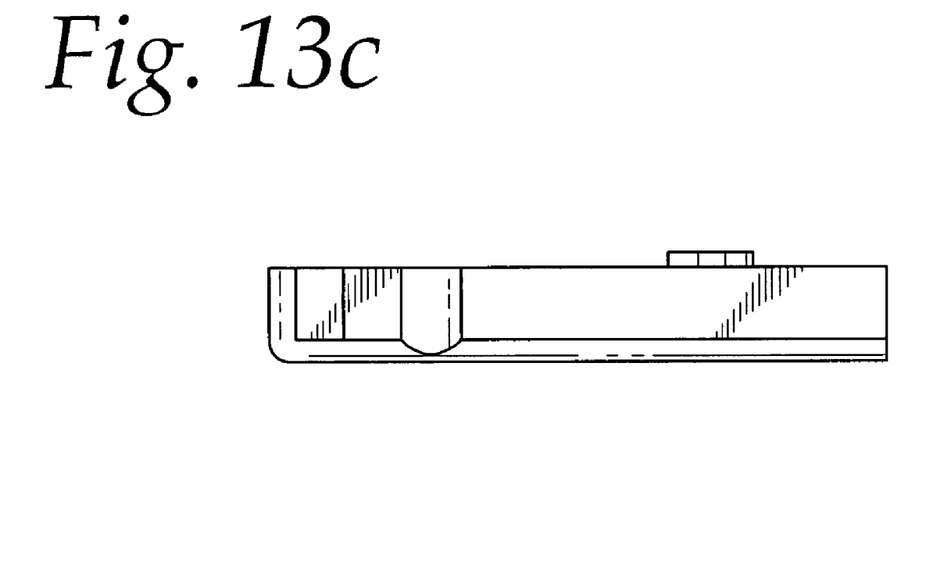
FIG. 13C is a front elevational view of the housing illustrated in FIG. 13A, shown in an open position.
Figure 13D:
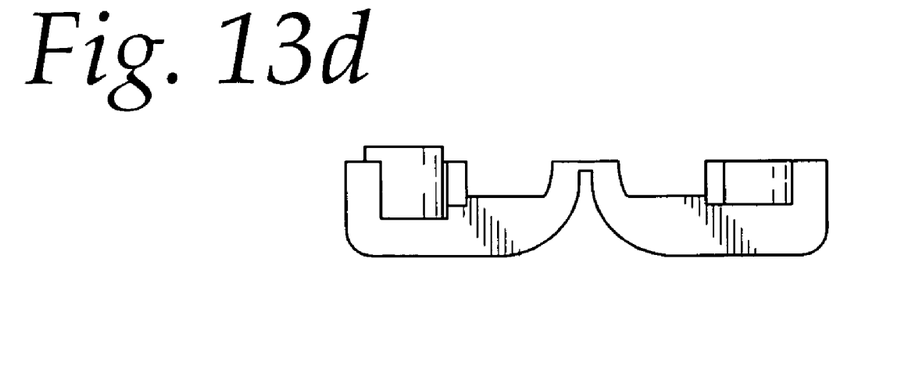
FIG. 13D is an end elevational view of the housing illustrated in FIG. 13A, shown in an open position.

In accordance with an important aspect of the invention, the circuit including the power connector and the indicator are integrated directly into the cable connector, such as an RJ45 connector. FIGS. 11, 12A and 12B illustrate an alternative embodiment of the invention that allows the circuit to be retrofit onto existing cables. Each of these embodiments is discussed separately below.

System Description

FIG. 1 illustrates a typical multiple computer environment which includes a plurality of computer workstations 9, 96, 97 and 103, computer laptops 94, 99 and 101, and peripheral devices 91, 98, and 104 linked by networking cable to data hubs 3 and 112 and computer servers 1 and 113. Typically, a computer room 108 houses the computer servers 1 and 113 and data hubs 3 and 112 of the computer network. Located separately, such as in room A 90, room B 95, room C 102, room D 100, and room E 93, are the computer workstations and the various devices of network. Devices include computer equipment, printers, scanners, and terminals. Between the computer workstations 9, 96, 97, and 103 and the servers 1 and 113 is a workstation panel 8 that holds the networking cable. The workstation panel may be located in the computer room 108 or may be located in a separate location such as what is known as a "closet." From the workstation panel 8 networking cable is used to connect the computers 9, 96, 97 and 103 to a hub 3, and 112 of one the servers 1, and 113. A typical computer network may use Ethernet as the protocol to support data transfer between computer and server pairs. Data includes distinct pieces of information. Each computer workstation or computer laptop is associated with one particular computer server. For example, in FIG. 1, John's Workstation 9 may be supported by computer server 1 and John's Workstation 9 may communicate with computer server 1 by utilizing the Ethernet protocol.

Embodiment Illustrated in FIGS. 2-9

Figure 2:
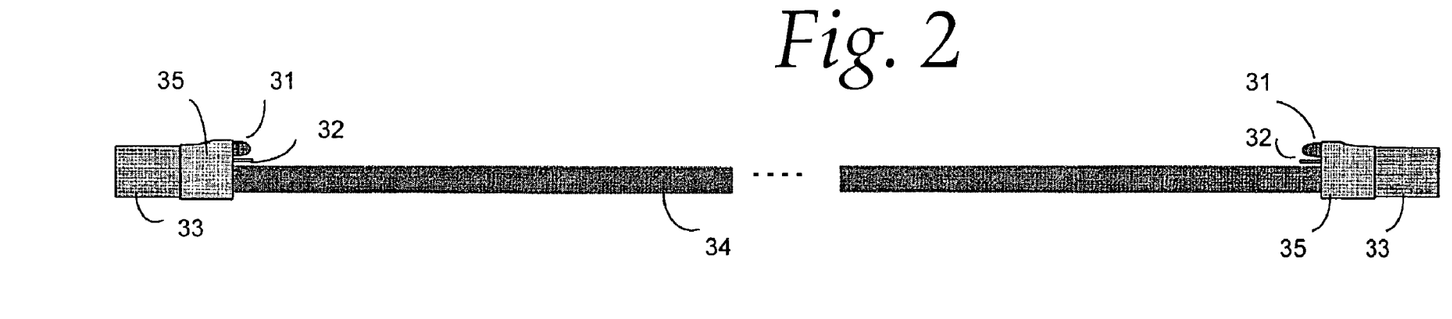
FIG. 2 is a schematic illustration of a networking cable employing teachings of this invention.
Figure 2A:
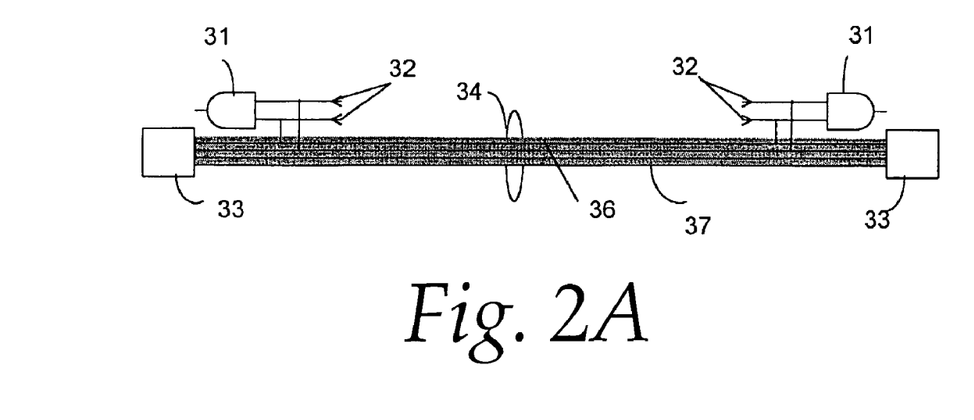
FIG. 2A is a schematic illustration of a networking cable as in FIG. 2.
Figure 3:
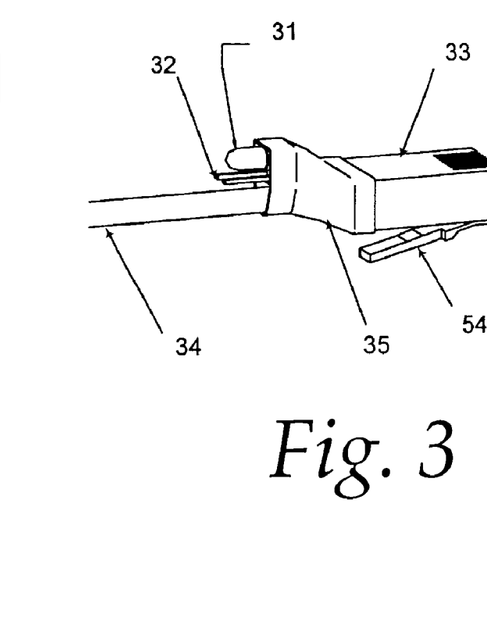
FIG. 3 is an enlarged view of the connector, telltale, and electric power connector of FIG. 2.
Figure 4:
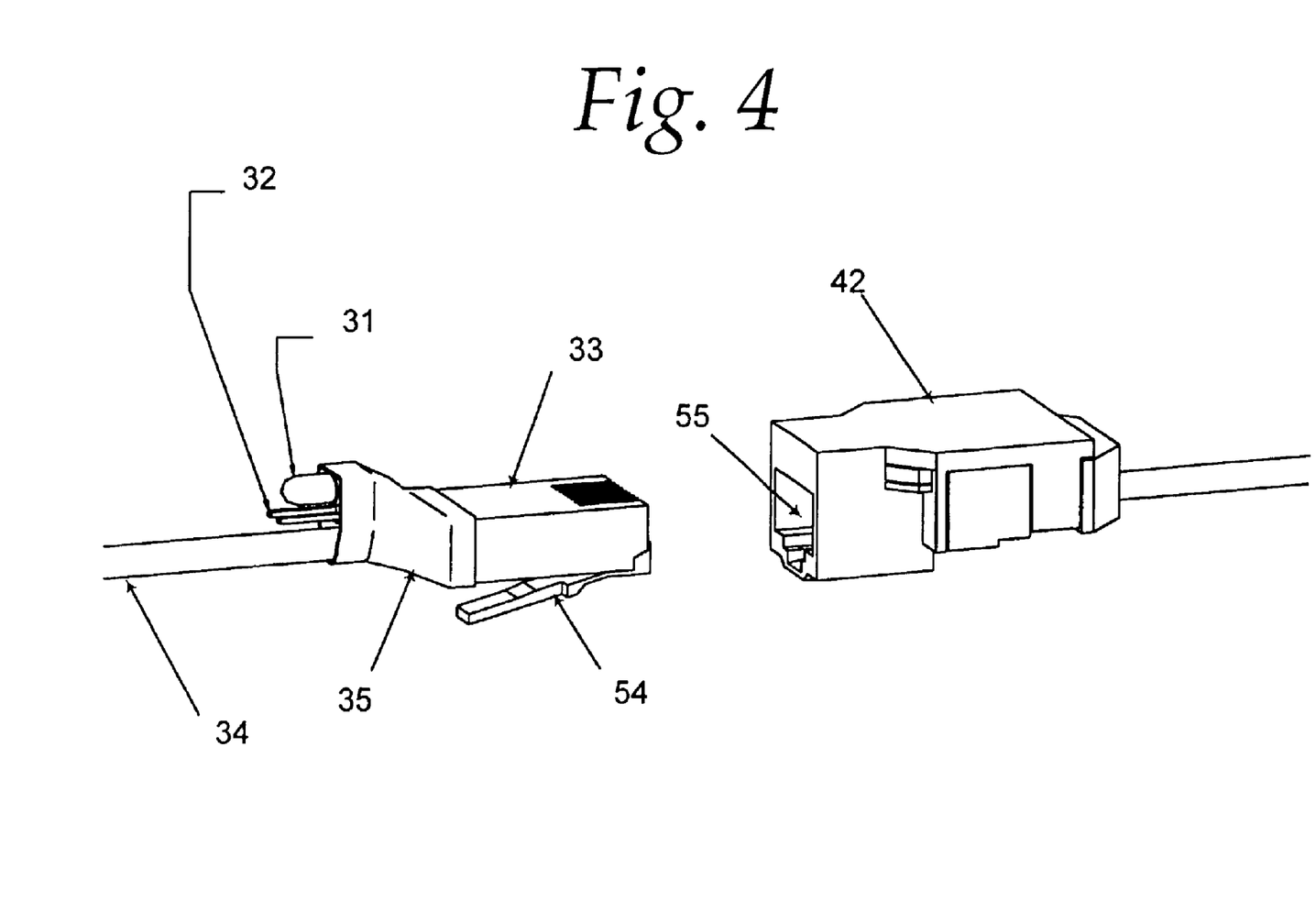
FIG. 4 is an enlarged view of the networking cable of FIG. 2 illustrating one end of the networking cable mating with a plug.
Figure 7:
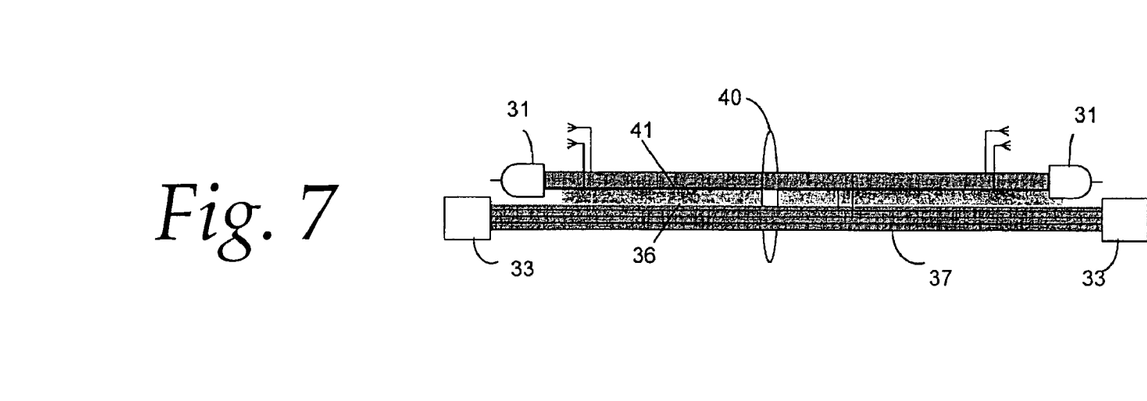
FIG. 7 illustrates an embodiment of the present invention wherein the networking cable 34 of FIG. 2 is replaced with a networking cable of five unshielded twisted copper pairs.

FIGS. 2-3 illustrate a networking cable which may be used in the computer environment of FIG. 1. The networking cable includes a composite cable 34 with a connector 33 at each end and an electrically operated telltale device 31 adjacent each of the connectors 33. The illustrated cable 34 includes four insulated twisted copper wires 36 encased in an outer cover jacket layer 37. In a preferred embodiment, the composite cable includes four copper wire pairs as is specified by Category 5 cabling standard, a Bellcore standard defined by an industry consortium. There may be more wire pairs for enhancement and/or protection of data transmission rates. In an embodiment of the invention as is illustrated in FIG. 7, five wire pairs are encased in the composite cable. In such an embodiment where five wire pairs are encased in the composite cable the networking cable is referred to as a "cablefinder" networking cable. Also, the composite cable may consist of coaxial, twinaxial, twisted, untwisted, shielded and unshielded pair wires, as is known in the art. Accordingly, the term "networking cable" is used in this description and in the appended claims to encompass all such variations of composite cable. Further, the various coating and covering components and variations thereof to form a basic networking cable are known in the networking cable art and will not be further described herein.

The illustrated telltale 31 is a light emitting diode (LED) mounted in a support block 35. A power connector also is provided immediately adjacent the LED and includes a pair of male contacts 32 for receiving appropriate plug prongs of a power source such as the battery pack unit 50 shown in FIG. 5.

Each of the electrical wires 36 is a small metallic electrical conductor, e.g. twisted copper pair, covered by a suitable insulation sheath. The wires 36 are embedded in the cable 34, preferably throughout its length at the time of manufacture of the cable. The electrical wires 36 are connected to the power connector 32 and to the telltales 31 such that upon applying electrical power through electrical wires 36, the telltales 31 are activated. Exposed end portions of the electrical wires 21,27 are physically and electrically connected to the leads 20,28 of the power connector 32 in any appropriate manner, for instance by being crimped in end portions of the power connector in a known manner or by other solderless termination techniques or by soldering. A flexible electrically insulated boot 35 surrounds the exposed ends of the wires 36 and the electrical interconnection with the telltales 31 and the power connector 32 to retain these components in assembled relation on the cable as well as to provide electrical insulation protection for the interconnections.

Figure 5:
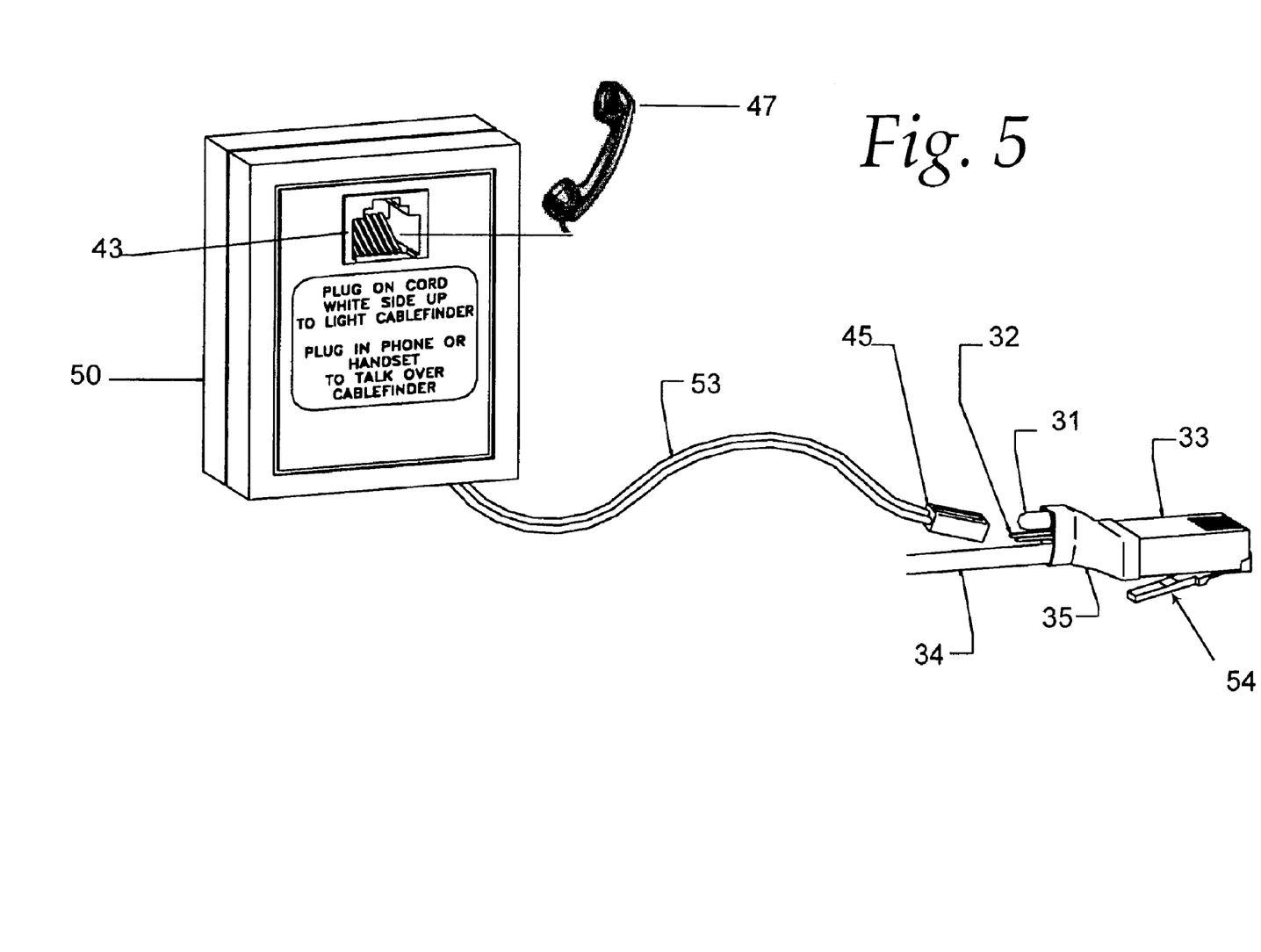
FIG. 5 is an illustration of a portable battery power source for activating the telltales of the networking cable of FIG. 2, and illustrating the inclusion of a telephonic device for communication over the networking cable.

Referring now to FIG. 3, the connectors are located on the ends of the length of the cable 34 and may be of any suitable design, such as six or eight conductor modular connectors. A type of six conductor modular connector that is used in Category 3, a Bellcore standard (as mentioned previously) defined by an industry consortium is the so-called RJ-11 connector. The illustrated connectors 33 are of the RJ45 type (an eight conductor modular connector), each comprising eight leads which are fixed in a housing. A latch 54 that is part of the housing includes an elongated locking mechanism for engaging a pin of a mating device 42 to effect a coupling affixation to such mating device 42. FIG. 5 illustrates such a situation. The right end of the connector 33, as seen in FIG. 5, illustrates a typical connector end for mating with a connector 42 and having a locking mechanism 54 for engaging in a slot 55 for retention purposes.

Figure 6:
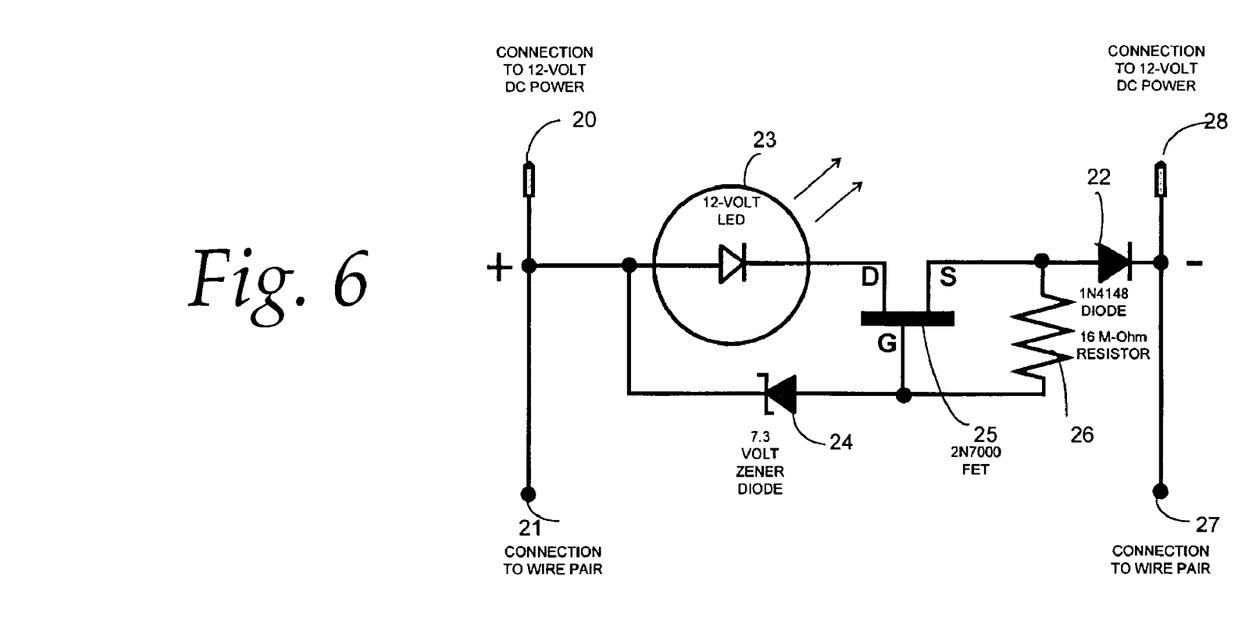
FIG. 6 is a schematic illustration of the indicator circuit used in the networking cable of FIG. 2.

Referring to FIG. 6, in a preferred embodiment of the invention, a networking cable indicator circuit is connected to two 21,27 of the four electrical wires 36. The DC inputs to the networking cable indicator circuit are connected across the third twisted wire pair 20,21 and the fourth twisted wire pair 27,28 of the networking cable. Although in a preferred embodiment, the third and fourth pairs are chosen, any two pairs may be used so that when power is not applied across the wires, data transmission is not affected. Further, in an illustrated embodiment as in FIG. 7, the networking cable indicator circuit may be connected to a fifth pair 41 so that when power is applied across the wires, data transmission is not affected. Such a preferred embodiment is called a "cable finder" networking cable.

The DC inputs to the networking cable indicator circuit are connected across two pairs (20, 21 and 27, 28) through a diode 22, light emitting diode (LED) 23, CMOS switching field effect transistor (FET) 25, zener diode 24, and resistor 26 which together implement the indicator circuit. A device suitable for use as a CMOS switching FET is available as model 2N7000 from Motorola Corp. of Santa Clara, Calif. A device suitable for use as a diode is available as model 1N4148 from Motorola of Phoenix, Ariz. Any suitable low current diode with a reverse breakdown higher than any expected voltage is suitable for the indicator circuit. Further, a preferred embodiment includes a 12-volt LED, a 7.3-Volt zener diode and a 16 M Ohm resister.

The indicator circuit is described as a high impedence LED-FET circuit. The indicator circuit is in a high impedance state if normal data transmission takes place. Normal data transmissions are defined by the Category 5 standard to take place at less than 7-Volts. For the Category 5 standard, when the voltage across the transmission wires 36 is less than 7 volts, then the indicator circuit appears to be invisible to data transmission and the impedance across the circuit is high. Whenever the voltage across the indicator circuit is greater than 7 volts, current flows through the circuit and the impedance across the circuit is low. A voltage greater than 7 will cause the FET to break down and the current to flow to light the LED.

The indicator circuit of FIG. 6 is designed so that when a higher voltage then the normal, voltage (7-Volts for Category 5) on the wires 36 is placed across the wires (20, 21 and 27, 28), then the circuit is in a low impedance state. If the voltage across the pair exceeds 7-Volts, then the impedance goes to the impedance of the LED, which is relatively low. In terms of current, the current flow across the LED at 12 volts is about 10 mA which is sufficient to illuminate the LED. Conversely, in the high impedance state, the current flow across the LED at less than the normal voltage of 7-Volts, is less than 10 uA. Although the circuit was designed for the normal voltage of 7-Volts, any pre-selected level may be chosen. Thus, an indicator circuit that is designed for a normal voltage of less than 7-Volts is considered to be equivalent. An equivalent circuit is any circuit that goes across those wires which does not allow significant current flow until you have applied an outside stimulus such as a 12-Volt power supply.

In a preferred embodiment, a FET is used to perform the switching function of turning on when the voltage is greater than the preselected level of 7-Volts. A switching relay, a programmable gate array or a programmable digital computer may perform this function. Such various switching elements and variations thereof are known in the computer art and will not be further described herein.

In a preferred embodiment, a 12-Volt LED and 12-Volt technology is used. This allows 12 volts to be available for the telephone. Further, the various LED, resistor, and current limiting diode combinations are known in the art and will not be further described herein. In an embodiment of the invention where the handset for the telephone talk circuit is not necessary, less than 12-Volt technology may be used in place of the 12-Volt technology. Further, using a higher voltage technology, such as 15-Volt LEDS or 24-Volt LEDS is also possible.

In another embodiment of the present invention, in place of the indicator circuit of FIG. 6, an LED 31 and power connector pins 32 are directly connected to the fifth pair 41 of transmission wires as illustrated in FIG. 8. This fifth pair 41 provides the tracing feature of the networking cable without interfering with data transmissions.

Referring to FIG. 5, a battery pack 50 includes a drycell battery, e.g. 12 volts, in a housing. The battery is suitably connected to a pair of external leads in a short, e.g. 8" flexible cable 53 which carries a power plug connector 45 that is mateable with the contacts 31. The pack 50 also supplies 12-Volt DC power to the jack 43 of telephonic device 47. Referring to FIG. 9 for example, the battery pack circuitry includes a 12-Volt DC battery 69, a 600 ohm ¼ watt resistor 77, a RJ11 jack 43 and a connecting cord 53 with 0.025 pin connector 45. In another arrangement, in place of the battery 69, a 15-Volt DC power supply may be provided which operates from a standard electrical outlet (typically on a wall) and connects to the battery pack. In yet another arrangement, a power supply may be provided which operates from a conventional 120-Volt AC power circuit which generates a DC power output. Accordingly, the term power pack is used in this description and in the appended claims to encompass all such variations of power packages.

Whether powered by an internal battery or using external power, the power pack preferably is portable for movement from work station to work station, and may be hand held or temporarily mounted adjacent a frame or panel such as by a clip or Velcro.RTM. securement. However, the power pack also may be a fixed installation, such as for panels and racks which serve a large number of networking cables. The leads 32 may be fixed to the power pack or may be patchcords, particularly in installations which include a fixed power pack, and may be free cords or may be mounted on automatic take-up reels or other forms of automatic returns.

Upon applying electrical power to the wires 36, as by the simple act of plugging in the battery power pack 50 to a power connector 32, the LED telltales 31 will be lighted. For example, a user who has identified one connector end of a computer network networking cable to be traced may plug the power pack into the conveniently adjacent power connector 32. The attendant illumination of the adjacent LED will signal that the telltale tracer system is operating. The user then seeks a correspondingly illuminated and hence readily visible telltale at another location to readily locate and identify the other terminal end. Further, in a multiple computer network interconnected by networking cables of the present invention, plugging the power pack into the power connector near a computer workstation will correspondingly illuminate the corresponding LEDs at a patchpanel 8, attached networking cables and associated computer server 1. Further, in a multiple computer network interconnected by networking cables of the present invention, electrical power may be applied by pressing a soft-key or function key on a keyboard of the workstation 9 will correspondingly illuminate the corresponding LEDs at a patchpanel 8, attached networking cables and associated computer server 1. The workstation may be wired so that pressing a soft key will provide electrical power to the networking cable. For example, a computer technician in a remote computer room 108 may call John at his workstation and ask him to press <F12> on the keyboard so that the corresponding LED at the server in the computer room 108 will be lit.

It will be appreciated that various telltale devices may be utilized, including for example conventional small light bulbs or liquid crystal or electromechanical indicators suitably mounted in the desired positions along the cable 34, wherever ease of identification is desired. For example, a light bulb or liquid crystal visual indicator may be substituted for each LED in a system as described with reference to FIGS. 2-8. One example of an electromechanical device such as may be used is a "Faranti Indicator", which has a movable disk that exposes either a flat black surface or a bright contrasting surface to the viewer as the device is subjected to successive electromagnetic pulses. The use of LEDs presently is preferred for simplicity and ruggedness. Further, different color telltale devices may be utilized for ease of identification. For example, a red colored LED may be used to signify an important computer connection that may not be disturbed.

Providing telltales and power connections separate from the connectors permits use of the system in networking cables using any type of cable connectorization. Also, the relative positions and orientation of the telltale and the power connector may be varied.

Referring now to FIG. 8, in an embodiment of the present invention an adapter is provided so that existing networking cables may be modified to provide the tracing feature. Such an adapter may be termed a "portfinder" adapter. Adapter 79 consists of the RJ45 mateable connector 42, composite cable 34 with attendant electrically activated telltales 31, RJ45 connector 33 as illustrated in FIG. 1 and indicator circuit as illustrated in FIG. 6. The RJ45 mateable connector 42 connects to so called standard "patchcables" or "jumpers". A computer network that is fully connected using standard "patchcables" or "jumpers" may be converted to the networking cable of this invention by using the adapter 79. Further, the adapter 79 provides for the tracing feature to a computer workstation, such as workstation 9 in FIG. 1. When adapter 79 is attached to an existing standard patchcable and power is applied to power pins 32, attached networking cables of this invention will illuminate. The cablefinder adapter allows for tracing of remote ends of cables from a computer workstation to a computer server.

The use of a portable plug-in battery pack provides a simple, flexible and cost-effective approach to powering and selectively activating the telltales. For example, the pack 50 of FIG. 5 may be clipped to a service person's belt for convenient use at any location. However, in some installations power may be supplied from fixed outlets associated with the cross connect system hardware which uses the networking cables, with voltage and current control provisions suitable to the electrical conductors and telltale devices being utilized. Electrical switches then may be provided at convenient locations, in lieu of the power connectors 32, for activating one or more of the telltales along a cable. An "alert" signal means, such as a sound emitting device, may be added at some or all indicator positions for activation by the same internal electrical signal power system simultaneously with activation of the visual indicators. This will serve to alert a worker to look for an activated visual telltale.

As indicated in FIGS. 5 and 9, the internal electrical conductors 36 also may serve for telephonic communication, such as between service personnel at positions remote from one another, in the manner of so-called "order wires" heretofore provided in wiring cables in telephone communications systems. Appropriate telephone jack sockets 43 may be provided at the respective positions, such as in association with the power connectors 32 or preferably in the power pack 50, to receive the jacks of telephonic device 47.

Further, a method of finding computer workstation and computer server/hub pairs is disclosed. However, it will be appreciated that this method may be used to find any device at the end of a networking cable. For example, a printer connected via networking cable may be located by use of this method.

Embodiment Illustrated in FIG. 10

An alternate embodiment of the circuit is illustrated in FIG. 10 and generally identified with the reference numeral 150. One or more circuits 150 may be connected across a two wires 164 and 166. The two wires 164 and 166 are included in a data cable having multiple wires, such as a standard Ethernet cable.

The circuit 150 may be located at one or more ends of the cable and may also be located intermediate at the ends as well. In one embodiment of the invention, the circuit 150 may be integrated into an RJ45 data connector in a similar manner as discussed above, or, alternatively, may be retrofit onto an existing cable, as illustrated in FIGS. 11, 12A and 12B and described below.

The circuit 150, similar to the embodiment illustrated in FIG. 6, includes a power connector 152, a switching circuit, shown within the box 154, an indicator 156 and a plurality of diodes 158, 160, 162, and 163. The circuit 150 has three modes of operation: a normal mode; an indication mode and a voice mode. In a normal mode, the circuit 150 is configured to present a high impedance across the two wires 164 and 166, for example, shown connected to CAT 6 PIN 6 and CAT 6 PIN 8. of an RJ 45 connector impedance through the expected operating frequency of the data carried by the two wires 164 and 166. For example, in an exemplary application in order to conform to TIA Category 6, the circuit impedance is selected to provide a relatively high impedance up to frequencies over 300 MHz. In a normal mode, none of the indicators 156 in any of the circuits 150 connected across the two wires 164 and 166 will illuminate because the DC voltage applied to the circuit will be less than a nominal value. As such, during normal operation, all of the indicators 156 will be off and the circuit 150 will present a relatively high impedance across the two wires 164 and 166 during the expected operating frequencies of the system to avoid disruption of the data in the signal wires 164 and 166. In an indication mode, the indicators 156 in all circuits 150 connected across the two wires 164 and 166 will illuminate when a nominal DC voltage is applied to the power connector 152 in any one circuit 150. In a voice mode, a talk path is established by connecting a nominal DC voltage to the power connectors 152 of at least two circuits 150 connected across the two wires 164 and 166. In the voice mode, additional equipment that is not part of the present invention is required to establish a voice path over the two wires 164 and 166.

In this embodiment of the circuit 150 the power connector 152 is a coaxial connector and is configured to receive an external source of DC power. As such, the circuit 150 is configured to take into account the impedance of the coaxial power connector in order to present a high impedance across the two wires 164 and 166 during a normal mode of operation.

Each circuit 150 connected across the two wires is responsive to two DC inputs. One input, a primary input, is by way of the power connector 152. The other DC input, a secondary input, is by way of its connection to other circuits 150 connected across the two wires 164 and 166. As will be clear from the discussion below, each circuit 150 becomes a secondary input to all other circuits 150 connected across the two wires 164 and 166 when a nominal DC voltage is applied to its power connector 152.

With reference to FIG. 10, in a normal mode of operation, when no voltage is applied to any of the coaxial power connectors 152 in any of the circuits 150 connected across the two wires 164 and 166, all of the diodes 158, 160, 162, and 163 are biased off. However, when a nominal voltage, for example, 9.0 volts DC is applied to the coaxial power connector 152 (i.e. primary input"), the diode 162, whose anode is connected to a positive DC rail, as well as the diode 163, whose cathode is connected to a negative DC rail, are biased on. During this mode of operation, the diodes 158 and 160 are also biased on, which turns on the switching circuit 154. As such, a closed current path is created from the positive DC rail through the diodes 160 and 162 and through the indicator 156 and returns through the switching circuit 154 and the diodes 158 and 163 to the negative DC rail, thus illuminating the indicator 156.

The following description illustrates the operation of a circuit 150 in response to a secondary DC input (i.e. when a nominal power supply is connected to the coaxial power connector of a remote circuit 150 connected across the two wires 164 and 166). In this situation, when a nominal 9.0 volt supply is applied to the coaxial power connector 152 of a remote circuit 150, a voltage of 7.8 volts DC is dropped across the two wires 164 and 166 which act as a secondary DC input for all other circuits 150 connected across the two wires 164 and 166. In this condition, the diode 162 is off. A positive voltage will be available on the wire 164 and will cause the diode 160 to be turned. In addition, a negative DC voltage will be available on the wire 166 which will cause the diode 158 to be turned on, which, in turn, will cause the diode 163 to be turned on and the switching circuit 154 to be turned on. A closed current path will be formed from the wire 164, which forms a positive DC rail, the diode 160, the switching circuit 154, the diode 158, the diode 163 and the negative rail. Thus, it should be clear that any time a nominal voltage is applied to any of the power connectors 152 in any of the circuits 115 connected to the two wires 164 and 166 along the cable, all of the indicators in all of the circuits 150 connected to those two wires 164 and 166 will illuminate.

The switching circuit 154 includes a current biasing resistor 168, a zener diode 170, and a switching transistor 172. The zener diode 170, for example, a Motorola model no. MM5Z4V7, is selected to limit the voltage applied to the base of the switching transistor 172. In the exemplary circuit 150 illustrated in FIG. 10, the breakdown voltage of the zener diode 170 is selected to be 4.7 volts DC. In particular, the zener diode 170 prevents the switching transistor 172 from turning on at voltages less than a nominal value. For example, in the exemplary application illustrated in FIG. 10, when a nominal, nine-volt DC source is applied to the coaxial connector 152, approximately 7.8 volts is dropped across the two wires 164 and 166. This 7.8 volt drop represents the nominal 9.0 volts minus the two diode drops across the diodes 162 and 164, which are about 0.6 volts a piece. The zener diode 170 with a breakdown voltage of 4.7 in combination with the current limiting resistor 168, illustrated in the exemplary embodiment as 100 K to prevent turn on of the switching transistor 172 until the voltage across the two wires 164 and 166 is greater than about 6.2 volts DC.

In the exemplary application illustrated in FIG. 10, when 7.8 volts DC appears across the two wires 164 and 166, about 6.6 volts DC is applied across the indicator 156 and the switching circuit 172. The 6.6 volts DC is dropped through the zener diode 170 and the current limiting resistor 168. In the exemplary application described, the breakdown voltage of the zener diode 170 and the value of the current limiting resistor 168 are selected so that the switching resistor 172 does not turn on unless the voltage present at the indicator 156 and switching transistor 172 is at least 5.6 volts DC and the current switched through the indicator 156 is about 15 mA at which point the indicator 156 and the circuit 150 as well as other indicators 156 disposed in other circuits 150 disposed along the cable illuminate.

Embodiment Illustrated in FIGS. 11-13

As mentioned above, the circuit, in accordance with the present invention, for example, as illustrated in FIGS. 6 and 10, can be retrofit onto existing cables, such as Ethernet cables. In particular, with reference to FIG. 11, an existing Ethernet cable 174 with a preformed connector 176 are illustrated. In accordance with another aspect of the invention, virtually any circuit including the circuits illustrated in FIGS. 6 and 10 can be retrofit onto existing cables 174 and provide the same functionality as cables in which the circuit is integrated into the end connectors as discussed above. In this embodiment, the circuit 150 is formed on a miniature printed circuit board (PCB) 178 and attached to the two wires 164 and 166 (e.g., CAT 6, PIN 6, CAT 6, PIN 8) by way of a pair of insulation displacement connectors (IDC) which simply require the wires to be pressed into a contact which strips away the insulation and electrically connects the wire to the terminal. As will be discussed in more detail below, circuits, as illustrated in FIGS. 6 and 10, as well as virtually any circuit, can essentially be retrofit onto any existing data cable by simply stripping off the outer sheath of the data cable; locating the two signal wires of interest; and inserting the two wires into the contacts of the IDC, thereby connecting the circuit to the two wires 164 and 166. After the circuit is connected to the two wires 164 and 166, an outer housing 177 is disposed around the area where the circuit was inserted for mechanical protection. The housing 177 is configured so that the power connector 152 and indicator 156 are accessible from outside the housing 177 as shown in FIG. 11.

FIGS. 12A and 12B illustrate the method of retrofitting an existing data cable to provide the functionality of the circuits illustrated in FIGS. 6 and 10, or other circuits. As shown, a standard data cable 174 is provided. The data cable 174 includes a plurality of wires, covered by an outside jacket. Initially, the outside jacket is removed along a length of the cable slightly longer than a PCB 178 used to carry the circuit. In particular, with the use of a cable stripper, or other device, the outer jacket of the data cable 174 is radially cut around its circumference in two locations, identified in FIGS. 12A and 12B with the reference numerals 180 and 182. Next, the outer jacket of the cable 174 is slit axially between the points 180 and 182 and the outer jacket is removed. It is important that none of the insulation on the twisted pairs within the cable 174 be damaged. After the section of outer jacket is removed, the two wires of interest are located, for example, wires connected to CAT 6, PIN 6 and PIN 8. For an exemplary data cable as manufactured by Allen Tel Products of Henderson, Nevada, under part no. AT16XX (i.e., XX=cable length), the two wires attached to PINS 6 and 8 of the RJ45 connector 186 are normally orange and brown. However, data cables and Ethernet cables made by other manufacturers may be color-coded differently. After the two wires 164 and 166 are located, each wire 164,166 is firmly pressed into the respective IDC contacts 188+ and 188− (FIG. 10), located on the PCB 17. In order to protect the circuit 150 after it has been connected, the housing 177 is disposed around the PCB 178 and the cable 174 as generally shown in FIG. 11.

Various configurations of the housing 177 are contemplated. An exemplary embodiment of the housing 177 is illustrated in FIGS. 13A-13D. As shown, the housing 177 is formed from two generally symmetrical housing halves 194 and 196. The housing halves 194 and 196 are formed with cavities 198 and 200 to receive PCB 178 and the length of cable 174. The housing halves 196 and 198 may be joined together with a flexible hinge 202. A pair of slots 204 and 26 are formed on one end of the housing halves 196 and 198 to capture the power connector 152 and the indicator 156, as generally shown in FIG. 11. Various conventional means may be used to secure the two housing halves 194 and 196 together, For example, the housing 177 provided with a may be provided with a pair of bosses 208 and 210, one of which is threaded, for receiving a screw 212 (FIG. 11) for securing the housing halves 194 and 196 together.

Obviously, many modifications and various of the present invention are possible in light of the above teachings. Thus, it is to be understood that, within the scope of the appended claims, the invention may be practiced otherwise than is specifically described above.

We claim:

1. A circuit for facilitating the identification of a remote end of an installed electrical cable having at least one pair of wires, the circuit comprising:
    an indicator;
    a switching circuit electrically coupled to said indicator; and
    a power connector for enabling an external DC voltage to be connected to said indicator and said switching circuit to cause said indicator to illuminate when the DC voltage applied to said power connector exceeds a nominal value and said switching circuit and said indicator are electrically coupled to said at least one pair of wires.

2. The circuit as recited in claim 1, wherein said circuit is configured to be integrated into a cable connector.

3. The circuit as recited in claim 1, wherein said circuit is configured to be retrofit into an existing cable.

* * * * *